(12) United States Patent
Kawamura

(10) Patent No.: US 8,736,320 B2
(45) Date of Patent: May 27, 2014

(54) POWER-ON RESET CIRCUIT

(75) Inventor: Yukio Kawamura, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 80 days.

(21) Appl. No.: 12/902,177

(22) Filed: Oct. 12, 2010

(65) Prior Publication Data

US 2011/0084740 A1    Apr. 14, 2011

(30) Foreign Application Priority Data

Oct. 13, 2009   (JP) ................................. 2009-236170

(51) Int. Cl.
*H03L 7/00*    (2006.01)

(52) U.S. Cl.
USPC ................................ 327/143; 327/80; 327/81

(58) Field of Classification Search
USPC ........................ 327/77, 78, 80, 81, 143, 198
See application file for complete search history.

(56) References Cited

U.S. PATENT DOCUMENTS

| 7,046,054 B2 * | 5/2006 | Lim ............................... 327/143 |
| 2006/0033540 A1 * | 2/2006 | Lee et al. ...................... 327/143 |
| 2007/0080725 A1 * | 4/2007 | Byeon et al. .................. 327/143 |
| 2008/0106308 A1 * | 5/2008 | Tu ................................. 327/143 |

FOREIGN PATENT DOCUMENTS

JP            05-183416          7/1993

\* cited by examiner

*Primary Examiner* — Long Nguyen
(74) *Attorney, Agent, or Firm* — Volentine & Whitt, PLLC

(57) ABSTRACT

A power-on reset circuit includes a first-conductive-type MOS transistor having a first source connected to a first power supply, a first drain, and a first gate connected to a second power supply; a second-conductive-type MOS transistor having a second source connected to the second power supply, a second drain connected to the first drain, and a second gate, to which a bias potential which depends on neither a potential of the first power supply nor a potential of the second power supply is applied; and an output node for outputting a reset signal corresponding to a potential of the first drain, in a process that a voltage between the first power supply and the second power supply increases.

17 Claims, 11 Drawing Sheets

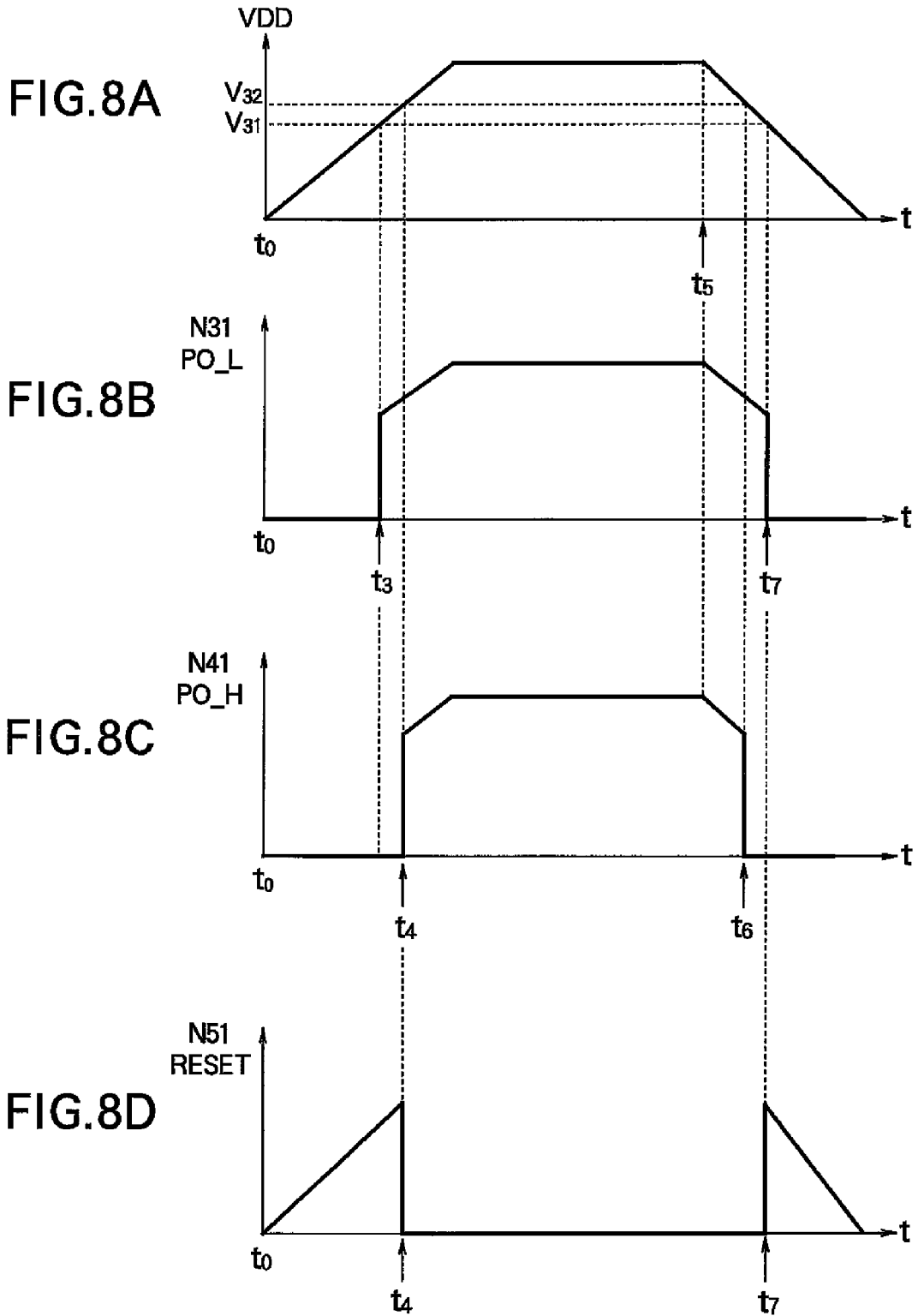

t=t₀ t=t₁₁ t=t₈ t=t₁₂ t=t₉
t=t₁₀

POWER-ON RESET CIRCUIT

BACKGROUND OF THE INVENTION

1. Field of the Invention

The present invention relates to a power-on reset circuit in a semiconductor integrated circuit.

2. Description of the Related Art

FIG. 1 is a circuit diagram illustrating a conventional typical power-on reset circuit. When power is turned on in the power-on reset circuit of FIG. 1 and a potential VDD of a power supply terminal 94 rises, a potential V1 of a node N1 rises more slowly than the potential VDD, through the use of an integration circuit which includes a resistor 91 and a capacitor 92. At this time, the potential VDD is also supplied to a PMOS transistor in an inverter 93, and so a threshold voltage VT (e.g., VDD/2) of the inverter 93 increases in proportion to the potential VDD. Immediately after the power is turned on, when the potential V1 of the node N1 is lower than the threshold voltage VT of the inverter 93, an output of the inverter 93 is high (H) level, and a potential V2 of a node N2 nearly equals the potential VDD. Then, when the potential V1 of the node N1 exceeds the threshold voltage VT, the inverter 93 changes to low (L) level, the potential V2 of the node N2 drops and approaches a GND potential, and thus a reset signal RESET is outputted.

However, the conventional power-on reset circuit has problems as follows: when the potential VDD of the power supply terminal 94 rises slowly immediately after the power is turned on in the circuit, the potential V1 of the node N1 which rises more slowly than the potential VDD cannot reach the threshold voltage VT of the inverter 93 which increases in proportion to the potential VDD, and thus the reset signal RESET may not be outputted to the node N2 which is an output of the inverter 93. Moreover, after the potential VDD of the power supply terminal 94 normally rises, when the potential VDD drops for an instant and then immediately recovers, i.e., a momentary power outage occurs, the potential V1 of the node N1 approximately remains the potential before the momentary power outage, and thus the reset signal RESET is not outputted to the node N2.

There is a proposal of a power-on reset circuit capable of generating a reset signal stably at a rising of a power supply potential and preventing the problems described above, for example, in Patent Document 1: Japanese Patent Kokai Publication No. 5-183416 (FIG. 1, FIG. 2, and paragraphs 0009 to 0014, for example). In the power-on reset circuit proposed in Patent Document 1, when the power supply potential (reference numeral 11 in FIG. 1) starts to rise and a current starts to flow through a bias circuit (a PMOS 12 and an NMOS 13 in FIG. 1), a current flows to an NMOS (reference numeral 15 in FIG. 1) through a resistor (reference numeral 14 in FIG. 1). When a potential of a connection node of these elements (reference symbol f in FIG. 1) incerases, the current which flows through the NMOS (reference numeral 15 in FIG. 1) increases, the potential of the connection node (reference symbol f in FIG. 1) accordingly drops to a GND potential, and the reset signal is outputted from an output terminal of an SR flip-flop circuit (reference numeral 21 in FIG. 1).

However, the circuit of Patent Document 1 requires the resistor of an extremely large resistance value (several megaohms to tens of megaohms, for example) for reducing consumption power, and so the resistor has a large area on a semiconductor integrated circuit. Consequently, it is difficult to reduce a size of the circuit.

Moreover, the circuit of Patent Document 1 requires a structure that an output potential of the bias circuit depends on the power supply potential, and so the bias circuit cannot be independently used. Consequently, it is not easy to control a current for reducing consumption power.

SUMMARY OF THE INVENTION

An object of the present invention is to provide a power-on reset circuit capable of outputting a reset signal stably and reducing a size of the circuit and consumption power.

According to an aspect of the present invention, a power-on reset circuit includes: a first-conductive-type MOS transistor having a first source connected to a first power supply, a first drain, and a first gate connected to a second power supply; a second-conductive-type MOS transistor having a second source connected to the second power supply, a second drain connected to the first drain, and a second gate, to which a bias potential which depends on neither a potential of the first power supply nor a potential of the second power supply is applied; and an output node for outputting a reset signal corresponding to a potential of the first drain, in a process that a voltage between the first power supply and the second power supply increases.

According to another aspect of the present invention, a power-on reset circuit includes: a first sensor circuit; a second sensor circuit; and a reset signal generating circuit for generating a reset signal. The first sensor circuit has a first first-conductive-type MOS transistor which has a first source connected to a first power supply, a first drain, and a first gate connected to a second power supply; a first second-conductive-type MOS transistor which has a second source connected to the second power supply, a second drain connected to the first drain, and a second gate to which a bias potential is applied; and a first node which outputs a first signal corresponding to a potential of the first drain, in a process that a voltage between the first power supply and the second power supply increases. The second sensor circuit has a second first-conductive-type MOS transistor which has a third source connected to the first power supply, a third drain, and a third gate connected to the second power supply; a second second-conductive-type MOS transistor which has a fourth source connected to the second power supply, a fourth drain connected to the third drain, and a fourth gate to which the bias potential is applied; and a second node which outputs a second signal corresponding to a potential of the third drain at timing occurring after timing of outputting the first signal from the first node, in the process that the voltage between the first power supply and the second power supply increases. The reset signal generating circuit generates the reset signal from the first signal and the second signal.

According to an aspect of the present invention, a size of a circuit and consumption power can be reduced, and a reset signal can be stably outputted.

BRIEF DESCRIPTION OF THE DRAWINGS

In the attached drawings:

FIGS. 8A to 8D are waveform diagrams illustrating an operation in the power-on reset circuit according to the third embodiment;

DETAILED DESCRIPTION OF THE INVENTION

Figure 1:
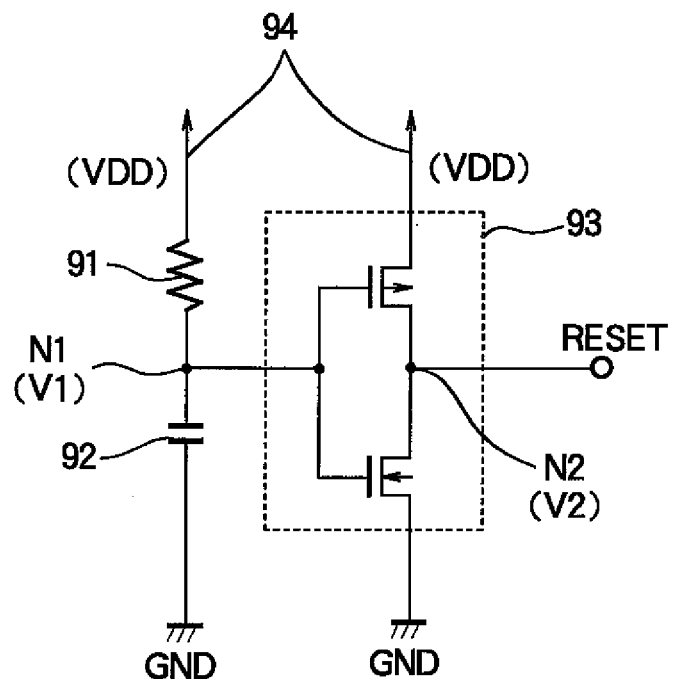
FIG. 1 is a circuit diagram illustrating a conventional power-on reset circuit.

Embodiments of the invention will now be described with reference to the attached drawings, in which like elements are indicated by like reference characters.

First Embodiment

Figure 2:
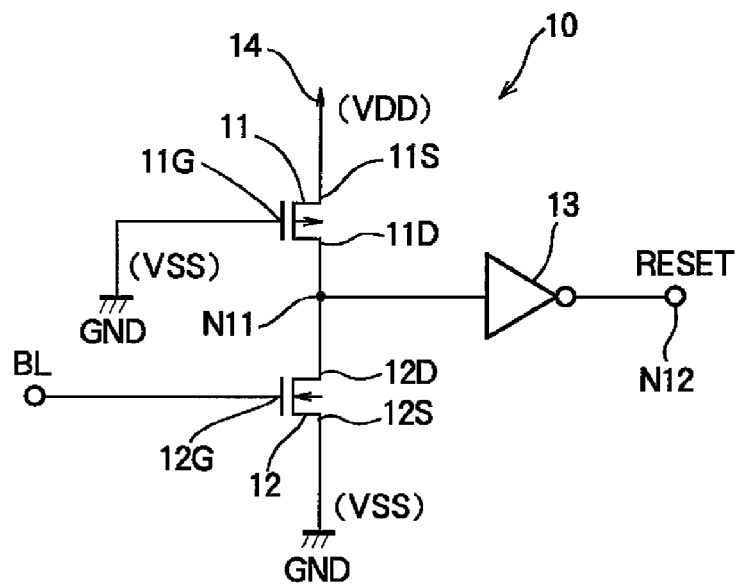
FIG. 2 is a circuit diagram illustrating a power-on reset circuit according to a first embodiment of the present invention.

FIG. 2 is a circuit diagram illustrating a power-on reset circuit 10 according to a first embodiment of the present invention. As illustrated in FIG. 2, the power-on reset circuit 10 according to the first embodiment has a P-type MOS transistor (PMOS) 11 which is a first-conductive-type MOS transistor, an N-type MOS transistor (NMOS) 12 which is a second-conductive-type MOS transistor, and an inverter 13. The PMOS 11 has a source 11S connected to a power supply terminal 14 (an electric potential VDD) which is a first power supply, a drain 11D, and a gate 11G connected to a GND terminal (a fixed electric potential VSS) which is a second power supply. The NMOS 12 has a source 12S connected to a ground (GND) terminal, a drain 12D connected to the drain 11D of the PMOS 11, and a gate 12G to which a bias potential BL is applied. The bias potential BL depends on neither the potential VDD of the power supply terminal 14 nor the potential VSS of the GND terminal. The inverter 13 is a CMOS inverter which has an input terminal from a node N11 connected to the drain 11D of the PMOS 11 and an output terminal to an output node N12, for example.

Figure 3:
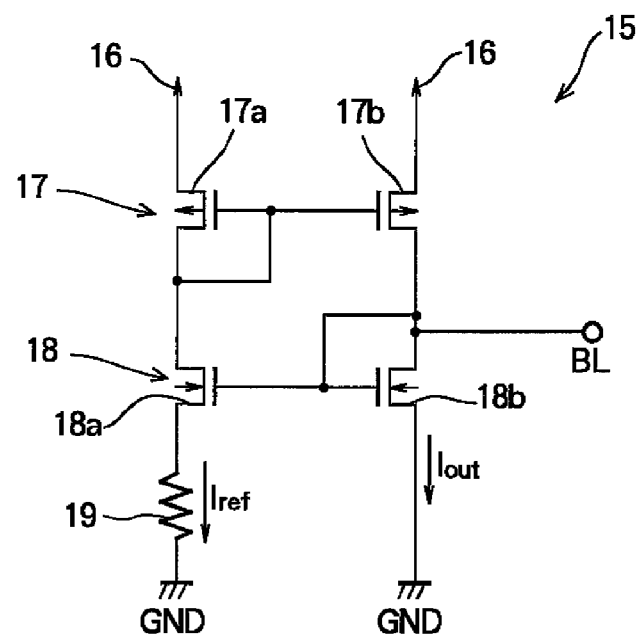
FIG. 3 is a circuit diagram illustrating an example of a bias circuit connected to the power-on reset circuits according to the first to fourth embodiments.

FIG. 3 is a circuit diagram illustrating an example of a bias circuit for supplying the bias potential BL to the power-on reset circuit 10 according to the first embodiment. The bias circuit 15 of FIG. 3 is a Constant-Gm Biasing circuit. The bias circuit 15 has a first current mirror circuit 17 which includes two PMOS transistors 17a and 17b, a second current mirror circuit 18 which includes two NMOS transistors 18a and 18b, and a resistor 19 for temperature compensation. Reference numerals 16 and GND denote a power supply terminal and a GND terminal, respectively. As illustrated in FIG. 3, when a reference current $I_{ref}$ flows through an input line of the bias circuit 15, a current $I_{out}$ which equals to (or is proportional to) the current $I_{ref}$ can flow through an output line, and a constant current can be supplied to a MOS transistor (the NMOS 12 in FIG. 2) of which a gate is connected to the bias output line of the bias potential BL, for example.

Figure 4A:
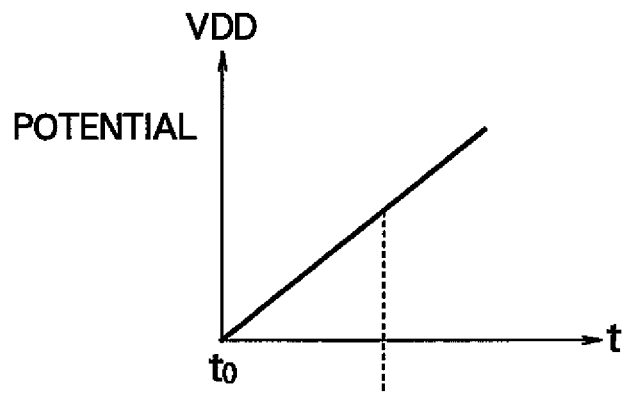
FIGS. 4A to 4C are waveform diagrams illustrating an operation in the power-on reset circuit according to the first embodiment.
Figure 4B:
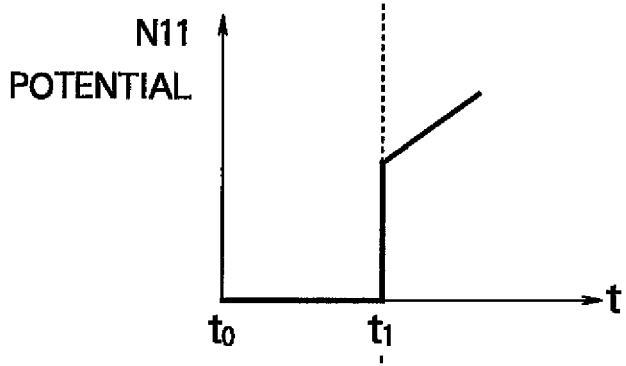
Figure 4C:
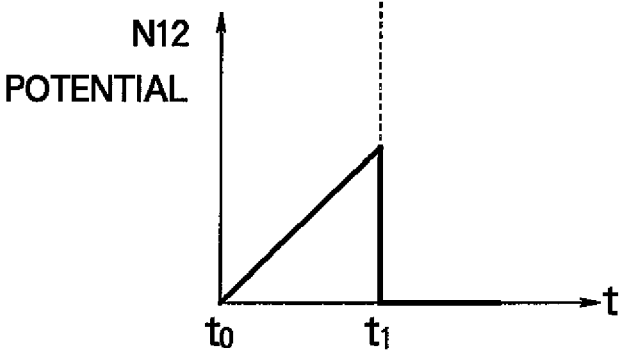

FIGS. 4A to 4C are waveform diagrams illustrating an operation in the power-on reset circuit 10 according to the first embodiment when power is turned on. At a time $t_0$, the power is turned on in the power-on reset circuit 10 of FIG. 2, and then the potential VDD of the power supply terminal 14 rises as illustrated in FIG. 4A. As illustrated in FIGS. 4A to 4C and FIG. 2, in a process that a voltage between the GND terminal and the power supply terminal 14 increases, when the voltage VDD of the power supply terminal 14 is low at first, a gate voltage Vgs of the PMOS 11 is small, a potential of the node N11 is lower than a threshold voltage VT of the inverter 13 (e.g., VDD/2), and so the output of the inverter 13 (the node N12) is high (H) level. Then, at a time $t_1$, the gate voltage Vgs of the PMOS 11 increases, and the potential of the node N11 increases and exceeds the threshold voltage VT. At this time, the output of the inverter 13 (the node N12) is low (L) level, and a potential of the node N12 drops and approaches the GND potential VSS. Thus, at the time $t_1$, a reset signal RESET which is inverted from H level to L level is outputted to the node N12.

A detailed example will be explained below. As illustrated in FIG. 4A, in the process that the potential VDD of the power supply terminal 14 rises, when the potential VDD of the power supply terminal 14 is low, the gate voltage Vgs of the PMOS 11 is small. At this time, a current flowing through the PMOS 11 is less than a constant current flowing through the NMOS 12, the node N11 is L level as illustrated in FIG. 4B, and the node N12 is supplied with H level.

According to a gradual increase in the potential VDD of the power supply terminal 14, the gate voltage Vgs of the PMOS 11 increases. Then, at the time $t_1$, a state changes and the current flowing through the PMOS 11 is greater than the constant current flowing through the NMOS 12. At this time, the node N11 changes to H level as illustrated in FIG. 4B and the node N12 is supplied with the reset signal RESET which is inverted from H level to L level.

Thus, in the power-on reset circuit 10 illustrated in FIG. 2, even if the potential VDD of the power supply terminal 14 rises slowly and the rising takes a long time, the reset signal RESET which is inverted from H level to L level is outputted to the node N12 at a time when the current flowing through the PMOS 11 exceeds a predetermined level.

After the potential VDD of the power supply terminal 14 normally reaches a predetermined potential, if the potential VDD falls, the circuit performs an operation opposite to that illustrated in FIGS. 4A to 4C, i.e., a signal which is inverted from L to H level is outputted to the node N12. For this reason, after the potential VDD of the power supply terminal 14 normally reaches the predetermined potential, even if the potential VDD drops for an instant and then immediately recovers, i.e., a momentary power outage occurs, the potential of the node N11 instantly follows the potential VDD. Thus, for an instant when the potential VDD of the power supply terminal 14 drops to a value at which the current flowing through the PMOS 11 is less than the constant current flowing through the NMOS 12, the node N12 is H level. When the potential VDD returns to the initial potential, the node N12 is supplied with L level.

As described above, according to the power-on reset circuit 10 of the first embodiment, a reset signal can be stably outputted, even if the potential VDD of the power supply terminal 14 rises slowly or if a momentary power outage occurs after the potential VDD rises. According to the power-on reset circuit 10 of the first embodiment, it is unnecessary for a semiconductor integrated circuit to have a resistor of a high resistance value in order to reduce consumption power, unlike the conventional art, thereby a size of the circuit and consumption power can be reduced.

Although the above explanation describes a case that the node N11 outputs a positive-phase signal (FIG. 4B) when the reset signal is generated (at the time $t_1$), the power-on reset circuit may be configured that the node N11 outputs a negative-phase signal and the inverter 13 is not included.

Second Embodiment

Figure 5:
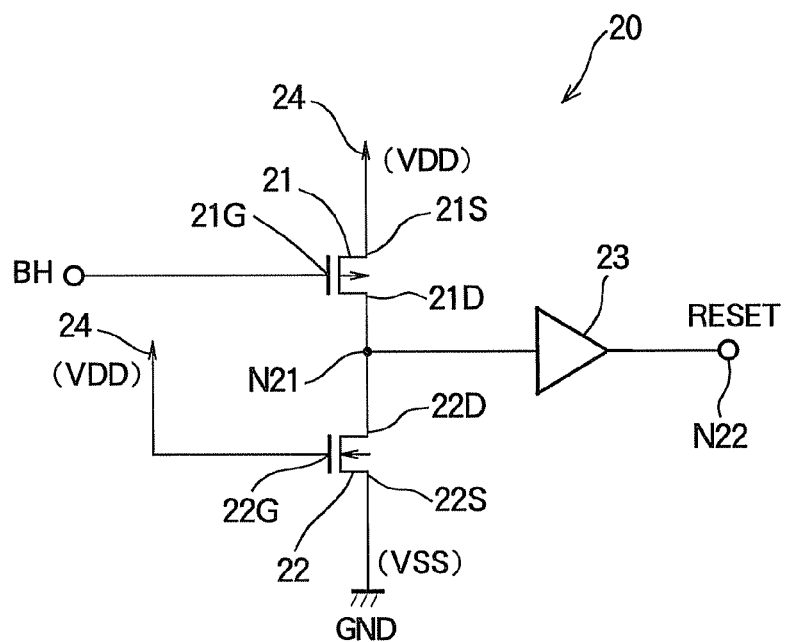
FIG. 5 is a circuit diagram illustrating the power-on reset circuit according to the second embodiment of the present invention.

FIG. 5 is a circuit diagram illustrating a power-on reset circuit 20 according to a second embodiment of the present invention. As illustrated in FIG. 5, the power-on reset circuit 20 according to the second embodiment has a PMOS 21 which is a second-conductive-type MOS transistor, an NMOS 22 which is a first-conductive-type MOS transistor, and a buffer 23. The PMOS 21 has a source 21S connected to a power supply terminal 24 (an electric potential VDD) which is a second power supply, a drain 21D, and a gate 21G to which a bias potential BH is applied. The bias potential BH depends on neither the potential VDD of the power supply terminal 24 nor a potential VSS of a GND terminal. The NMOS 22 has a source 22S connected to a GND terminal (the fixed electric potential VSS) which is a first power supply, a drain 22D connected to the drain 21D of the PMOS 21, and a gate 22G connected to the power supply terminal 24. The buffer 23 has an input terminal from a node N21 connected to the drain 21D of the PMOS 21 and an output to an output node N22. A circuit for supplying the bias potential BH which is a bias circuit similar to the circuit of FIG. 3, for example, can supply a constant current to a MOS transistor (the PMOS 21 in FIG. 5) of which a gate is connected to a bias output line of the bias potential BH.

Figure 6A:
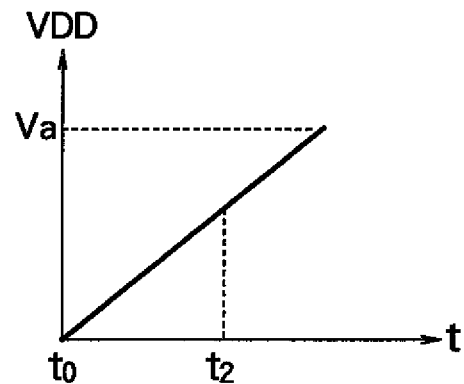
FIGS. 6A to 6C are waveform diagrams illustrating an operation in the power-on reset circuit according to the second embodiment.
Figure 6B:
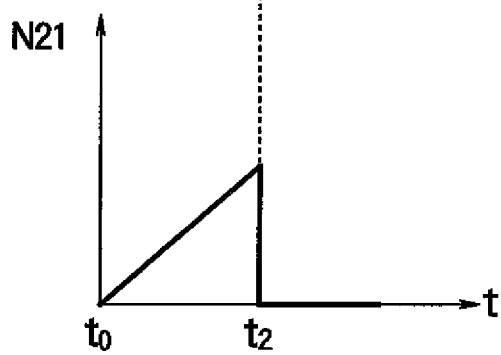
Figure 6C:
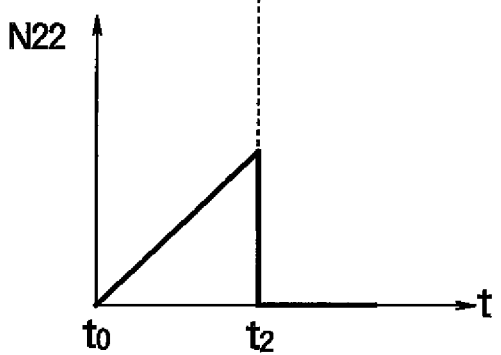

FIGS. 6A to 6C are waveform diagrams illustrating an operation in the power-on reset circuit 20 according to the second embodiment when power is turned on. At a time $t_0$, the power is turned on in the power-on reset circuit 20 of FIG. 5, and then the potential VDD of the power supply terminal 24 rises as illustrated in FIG. 6A. As illustrated in FIGS. 6A to 6C and FIG. 5, in a process that a voltage between the GND terminal and the power supply terminal 24 increases, at first (at the time $t_0$), a current flowing through the NMOS 22 is less than a constant current flowing through the PMOS 21, a potential of the node N21 gradually increases, and an output of the buffer 23 (the node N22) gradually increases. Then, at a time $t_2$, the potential VDD of the power supply terminal 24 increases to a value at which the current flowing through the NMOS 22 is greater than the constant current flowing through the PMOS 21. At this time, the node N21 is L level, the output of the buffer 23 (the node N22) is L level, and thus a reset signal RESET which is inverted from H level to L level is outputted to the node N22.

As described above, according to the power-on reset circuit 20 of the second embodiment, a reset signal can be stably outputted, even if the potential VDD of the power supply terminal 24 rises slowly or if a momentary power outage occurs after the potential VDD rises. According to the power-on reset circuit 20 of the second embodiment, it is unnecessary for a semiconductor integrated circuit to have a resistor of a high resistance value in order to reduce consumption power, unlike the conventional art, thereby a size of the circuit and consumption power can be reduced.

Third Embodiment

Figure 7:
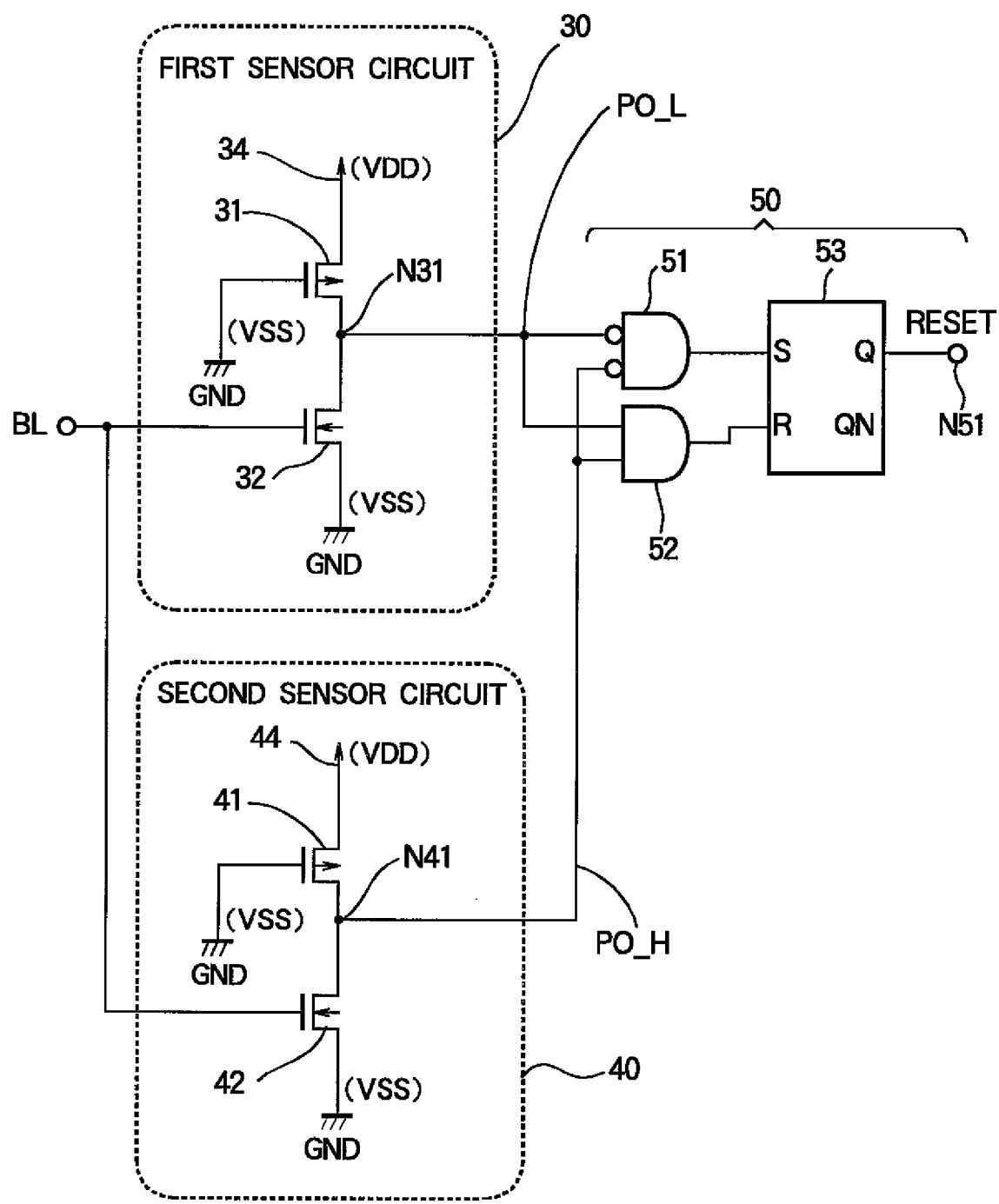
FIG. 7 is a circuit diagram illustrating the power-on reset circuit according to the third embodiment of the present invention.

FIG. 7 is a circuit diagram illustrating a power-on reset circuit according to a third embodiment of the present invention. As illustrated in FIG. 7, the power-on reset circuit according to the third embodiment has a first sensor circuit 30, a second sensor circuit 40, and a reset signal generating circuit 50.

The first sensor circuit 30 has a PMOS 31 which is a first first-conductive-type MOS transistor, an NMOS 32 which is a first second-conductive-type MOS transistor, and a node N31 which outputs a first signal (whose electric potential is inverted) PO_L in a process that a voltage between a GND terminal and a power supply terminal 34 increases. The PMOS 31 has a source connected to the power supply terminal 34 (an electric potential VDD) which is a first power supply, a drain, and a gate connected to the GND terminal (a fixed electric potential VSS) which is a second power supply. The NMOS 32 has a source connected to the GND terminal, a drain connected to the drain of the PMOS 31, and a gate to which a bias potential BL is applied. The potential BL depends on neither the potential VDD of the power supply terminal 34 nor the potential VSS of the GND terminal. The PMOS 31 operates in a similar manner to the PMOS 11 of FIG. 2 and the NMOS 32 operates in a similar manner to the NMOS 12 of FIG. 2.

The second sensor circuit 40 has a PMOS 41 which is a second first-conductive-type MOS transistor, an NMOS 42 which is a second second-conductive-type MOS transistor, and a node N41 which outputs a second signal (whose electric potential is inverted) PO_H in a process that a voltage between the GND terminal and a power supply terminal 44 increases. The second sensor circuit 40 is configured so that timing of outputting the second signal (whose electric potential is inverted) PO_H to the node N41 of the second sensor circuit 40 in the process that the voltage of the power supply terminal 44 increases occurs after timing of outputting the first signal (whose electric potential is inverted) PO_L to the node N31 of the first sensor circuit 30. The PMOS 41 has a source connected to a power supply terminal 44 (the electric potential VDD), a drain, and a gate connected to a GND terminal (the fixed electric potential VSS). The NMOS 42 has a source connected to the GND terminal, a drain connected to the drain of the PMOS 41, and a gate to which the bias potential BL is applied. The bias potential BL depends on neither the potential VDD of the power supply terminal 44 nor the potential VSS of the GND terminal. The PMOS 41 operates in a similar manner to the PMOS 11 of FIG. 2 and the NMOS 42 operates in a similar manner to the NMOS 12 of FIG. 2.

A circuit for supplying a constant current to the NMOS 32 and the NMOS 42 has a structure similar to the bias circuit of FIG. 3, for example.

The reset signal generating circuit 50 generates a reset signal RESET from potentials of the first signal PO_L and the second signal PO_H, and outputs the generated signal to a node N51. The reset signal generating circuit 50 has a NOR gate 51 which has inputs of the potential of the first signal PO_L from the first node N31 and the potential of the second signal PO_H from the second node N41, an AND gate 52 which has inputs of the potential of the first signal PO_L from the first node N31 and the potential of the second signal PO_H from the second node N41, and a set-reset (SR) flip-flop circuit 53 which has a set terminal S to which an output of the NOR gate 51 is inputted and a reset terminal R to which an output of the AND gate 52 is inputted.

In the third embodiment, a potential VDD value V31 (FIG. 8A) at which the potential of the first signal PO_L is inverted in the first sensor circuit 30 differs from a potential VDD value V32 (FIG. 8A) at which the potential of the second signal PO_H is inverted in the second sensor circuit 40. For this reason, timing when the potential of the first signal PO_L is inverted in the first sensor circuit 30 differs from timing when the potential of the second signal PO_H is inverted in the second sensor circuit 40. In the third embodiment, the potential VDD value V31 at which the potential of the first signal PO_L is inverted in the first sensor circuit 30 is set to be less than the potential VDD value V32 at which the potential of the second signal PO_H is inverted in the second sensor circuit 40.

FIGS. 8A to 8D are waveform diagrams illustrating an operation in the power-on reset circuit according to the third embodiment; and FIGS. 9A to 9E are explanatory diagrams of the operation in the power-on reset circuit according to the third embodiment.

First, it will be explained how the circuit operates when the power supply potential rises. At a time $t_0$, power is turned on in the power-on reset circuit of FIG. 7, and then the potential VDD of the power supply terminals 34 and 44 rises as illustrated in FIG. 8A. As illustrated in FIGS. 8A to 8D and FIG. 9A, at the time $t_0$, the potentials of the nodes N31 and N41 are L level, the output of the NOR gate 51 is H level, and the output of the AND gate 52 is L level. As a result, the node N51 which is an output of the SR flip-flop circuit 53 is H level.

Figure 9A:
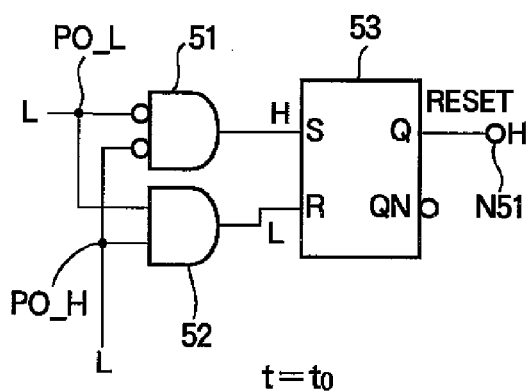
FIGS. 9A to 9E are explanatory diagrams illustrating the operation of the power-on reset circuit according to the third embodiment.
Figure 9D:
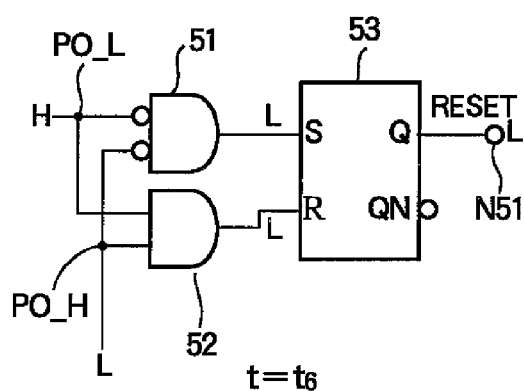
Figure 9B:
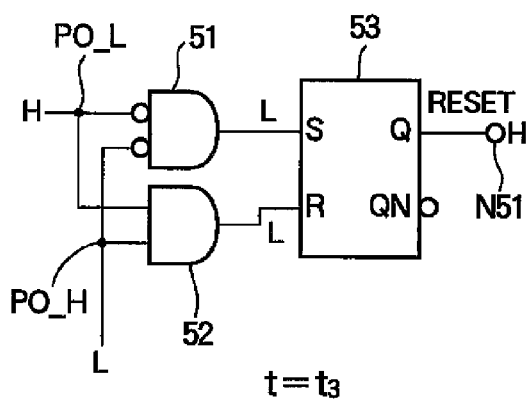

As illustrated in FIG. 8B and FIG. 9B, at a time $t_3$, the potential of the first signal PO_L at the node N31 is inverted from L to H level, and the potential of the second signal PO_H at the node N41 remains L level. At this time, the output of the NOR gate 51 changes from H level to L level, and the output of the AND gate 52 remains L level. As a result, the node N51 which is the output of the SR flip-flop circuit 53 remains H level.

Figure 9E:
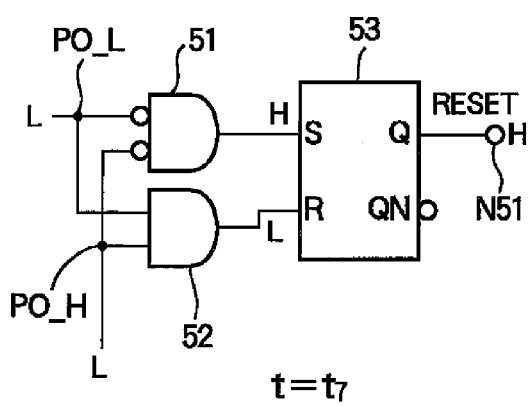
Figure 9C:
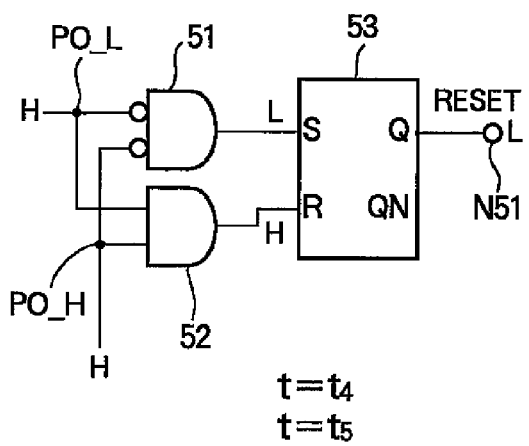

As illustrated in FIG. 8C and FIG. 9C, at a time $t_4$, the potential of the second signal PO_H at the node N41 is inverted from L to H level. At this time, the output of the NOR gate 51 remains L level, and the output of the AND gate 52 changes from L to H level. As a result, the node N51 which is the output of the SR flip-flop circuit 53 changes from H level to L level, and thus the reset signal RESET is generated.

Next, it will be explained how the circuit operates when the power supply potential falls. At a time $t_5$, the power supply potential in the power-on reset circuit of FIG. 7 drops, and then the potential VDD of the power supply terminals 34 and 44 drops as illustrated in FIG. 8A. As illustrated in FIGS. 8A to 8D and FIG. 9D, at a time $t_6$, the potential of the node N31 remains H level, the potential of the node N41 changes from H level to L level, the output of the NOR gate 51 is L level, and the output of the AND gate 52 is L level. As a result, the node N51 which is the output of the SR flip-flop circuit 53 remains L level.

As illustrated in FIG. 8B and FIG. 9E, at a time $t_7$, the potential of the first signal PO_L at the node N31 is inverted from H level to L level, and the potential of the node N41 remains L level. At this time, the output of the NOR gate 51 changes from L to H level, and the output of the AND gate 52 is L level. As a result, the node N51 which is the output of the SR flip-flop circuit 53 is inverted from L to H level.

As described above, according to the power-on reset circuit of the third embodiment, the reset signal can be stably outputted, even if the potential VDD of the power supply terminals 34 and 44 rises slowly or if a momentary power outage occurs after the potential VDD rises. According to the power-on reset circuit of the third embodiment, it is unnecessary for a semiconductor integrated circuit to have a resistor of a high resistance value in order to reduce consumption power, unlike the conventional art, thereby a size of the circuit and consumption power can reduced.

In the power-on reset circuit according to the third embodiment, when the power supply potential VDD rises, the potential of the node N51 is inverted and the reset signal RESET is generated at timing depending on the second sensor circuit 40 (at the time $t_4$). On the other hand, when the power supply potential VDD falls, the potential of the node N51 is inverted at timing depending on the first sensor circuit 30 (at the time $t_7$). Therefore, in the power-on reset circuit according to the third embodiment, timing of potential inversion at the node N51 can be independently set for the rising and the falling of the power supply potential.

Fourth Embodiment

Figure 10:
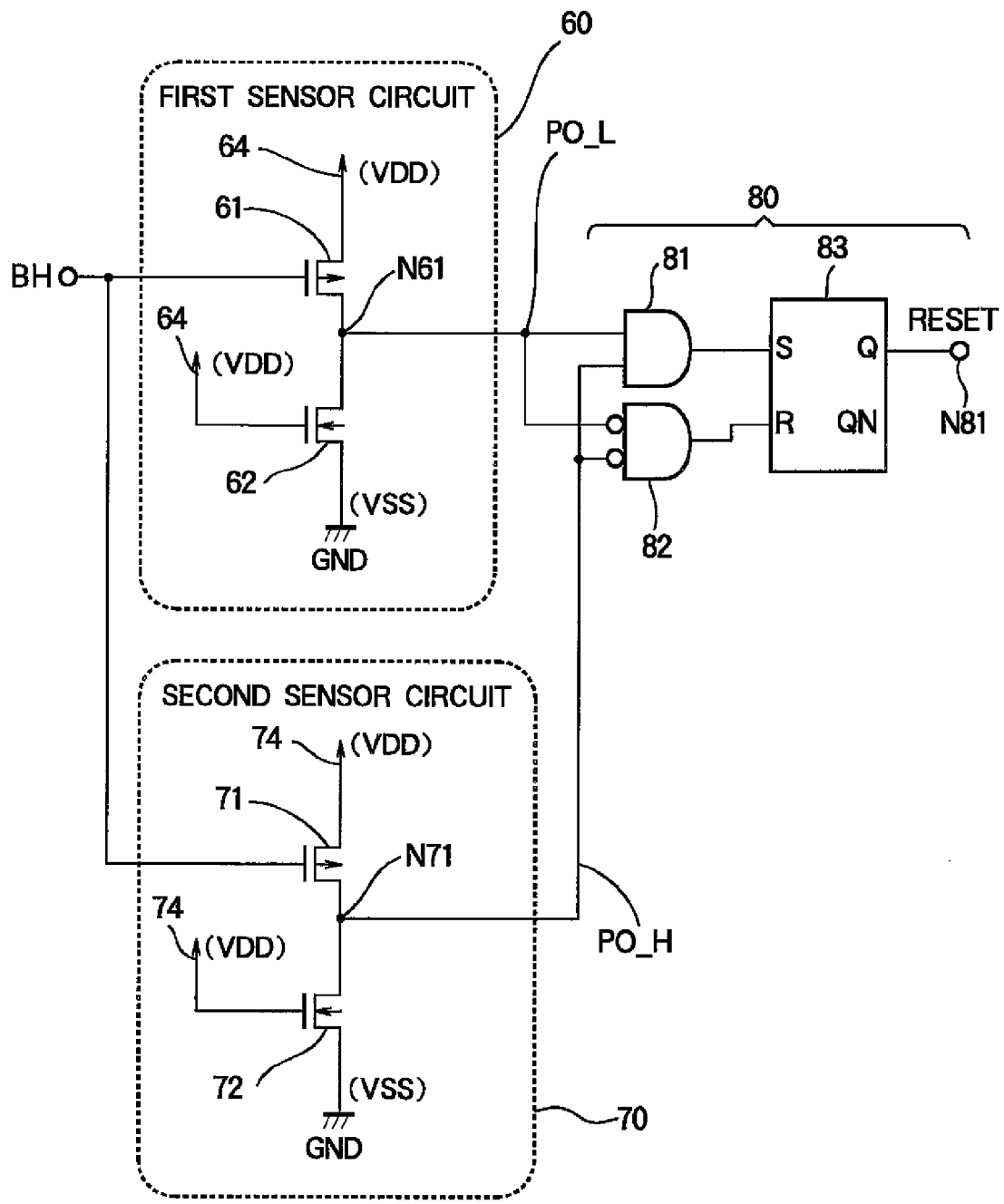
FIG. 10 is a circuit diagram illustrating the power-on reset circuit according to the fourth embodiment of the present invention.

FIG. 10 is a circuit diagram illustrating a power-on reset circuit according to a fourth embodiment of the present invention. As illustrated in FIG. 10, the power-on reset circuit according to the fourth embodiment has a first sensor circuit 60, a second sensor circuit 70, and a reset signal generating circuit 80.

The first sensor circuit 60 has a PMOS 61 which is a first second-conductive-type MOS transistor, an NMOS 62 which is a first first-conductive-type MOS transistor, and a node N61 which outputs a first signal (whose electric potential is inverted) PO_L in a process that a voltage between a GND terminal and a power supply terminal 64 increases. The PMOS 61 has a source connected to the power supply terminal 64 (an electric potential VDD) which is a second power supply, a drain, and a gate to which a bias potential BH is applied. The bias potential BH depends on neither the potential VDD of the power supply terminal 64 nor a potential VSS of the GND terminal. The NMOS 62 has a source connected to the GND terminal (the fixed electric potential VSS), a drain connected to the drain of the PMOS 61, and a gate connected to the power supply terminal 64. The PMOS 61 operates in a similar manner to the PMOS 21 of FIG. 5 and the NMOS 62 operates in a similar manner to the NMOS 22 of FIG. 5.

The second sensor circuit 70 has a PMOS 71 which is a second second-conductive-type MOS transistor, an NMOS 72 which is a second first-conductive-type MOS transistor, and a node N71 which outputs a second signal (whose electric potential is inverted) PO_H in a process that a voltage between the GND terminal and a power supply terminal 74 increases. The second sensor circuit 70 is configured so that timing of outputting the second signal (whose electric potential is inverted) PO_H to the node N71 in the second sensor circuit 70 in the process that the voltage of the power supply terminal 74 increases occurs after timing of outputting the first signal (whose electric potential is inverted) PO_L to the node N61 in the first sensor circuit 60. The PMOS 71 has a source connected to the power supply terminal 74 (the electric potential VDD) which is a second power supply, a drain, and a gate to which the bias potential BH is applied. The bias potential BH depends on neither the potential VDD of the power supply terminal 74 nor the potential VSS of the GND terminal. The NMOS 72 has a source connected to the GND terminal (the fixed electric potential VSS), a drain connected to the drain of the PMOS 71, and a gate connected to the power supply terminal 74. The PMOS 71 operates in a similar manner to the PMOS 21 of FIG. 5 and the NMOS 72 operates in a similar manner to the NMOS 22 of FIG. 5.

A circuit for supplying a constant current to the PMOS 61 and the PMOS 71 has a structure similar to the bias circuit of FIG. 3, for example.

The reset signal generating circuit 80 generates a reset signal RESET from potentials of the first signal PO_L and the second signal PO_H, and outputs the generated signal to a node N81. The reset signal generating circuit 80 has an AND gate 81 which has inputs of the potential of the first signal PO_L from the first node N61 and the potential of the second signal PO_H from the second node N71, a NOR gate 82 which has inputs of the potential of the first signal PO_L from the first node N61 and the potential of the second signal PO_H from the second node N71, and a SR flip-flop circuit 83 which has a set terminal S to which an output of the AND gate 81 is inputted and a reset terminal R to which an output of the NOR gate 82 is inputted.

In the forth embodiment, a potential VDD value V41 (FIG. 11A) at which the potential of the first signal PO_L is inverted in the first sensor circuit 60 differs from a potential VDD value V42 (FIG. 11A) at which the potential of the second signal PO_H is inverted in the second sensor circuit 70. For this reason, timing when the potential of the first signal PO_L is inverted in the first sensor circuit 60 differs from timing when the potential of the second signal PO_H is inverted in the second sensor circuit 70. In the fourth embodiment, the potential VDD value V41 at which the potential of the first signal PO_L is inverted in the first sensor circuit 60 is set to be less than the potential VDD value V42 at which the potential of the second signal PO_H is inverted in the second sensor circuit 70.

FIGS. 11A to 11D are waveform diagrams illustrating an operation in the power-on reset circuit according to the fourth embodiment; and FIGS. 12A to 12E are explanatory diagrams of the operation in the power-on reset circuit according to the fourth embodiment.

Figure 11A:
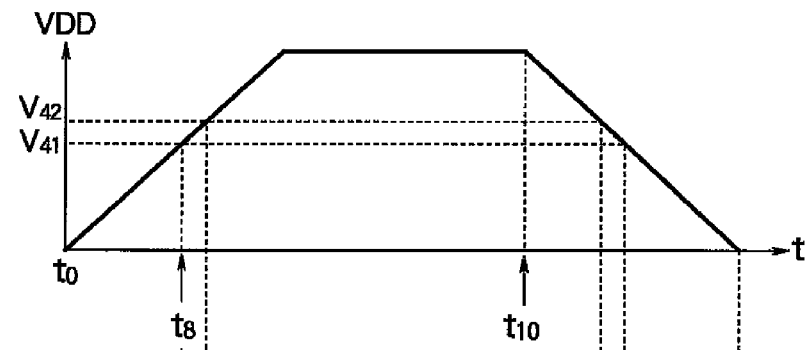
FIGS. 11A to 11D are waveform diagrams illustrating an operation in the power-on reset circuit according to the fourth embodiment.

First, it will be explained how the circuit operates when the power supply potential rises. At a time $t_0$, power is turned on in the power-on reset circuit of FIG. 10, and then the potential VDD of the power supply terminals 64 and 74 rises as illustrated in FIG. 11A. As illustrated in FIGS. 11A to 11D and FIG. 12A, at the time $t_0$, the potentials of the nodes N61 and N71 are L level, the output of the AND gate 81 is H level, and the output of the NOR gate 82 is L level. As a result, the node N81 which is an output of the SR flip-flop circuit 83 is H level.

Figure 11B:
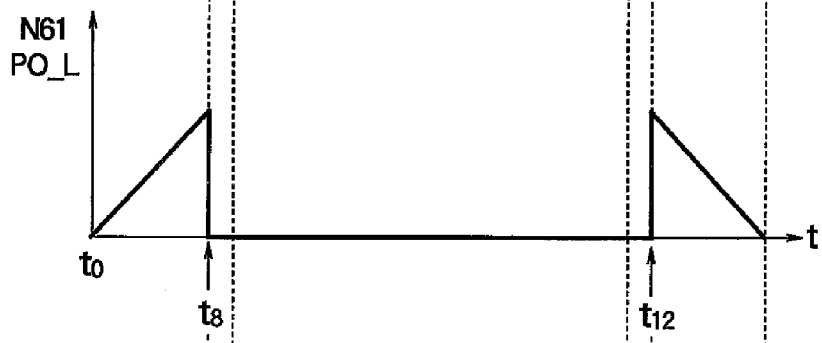
Figure 12A:
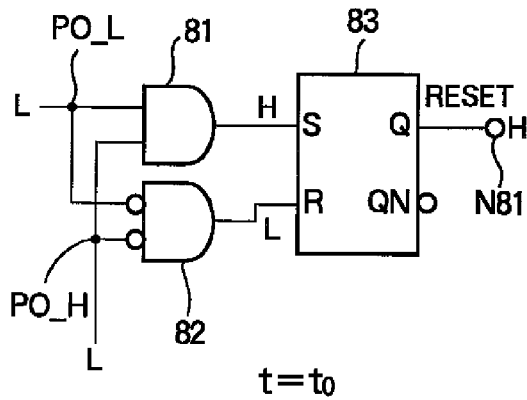
FIGS. 12A to 12E are explanatory diagrams illustrating the operation in the power-on reset circuit according to the fourth embodiment.
Figure 12D:
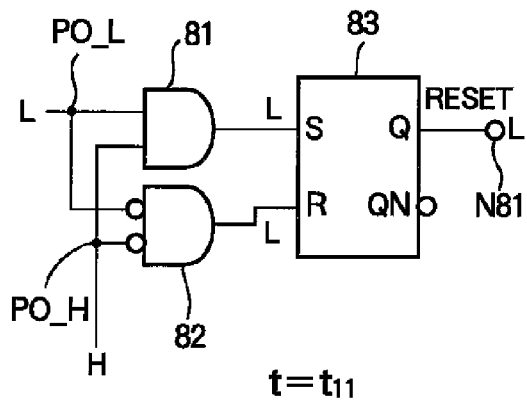
Figure 12B:
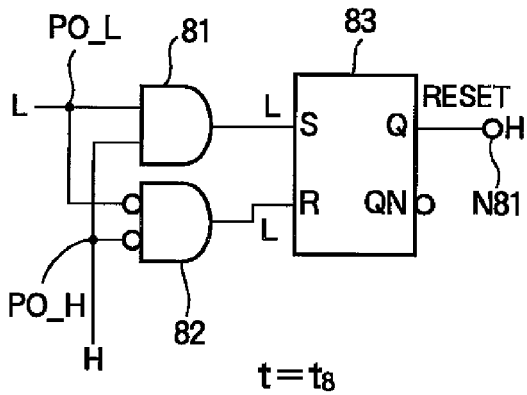

As illustrated in FIG. 11B and FIG. 12B, at a time $t_8$, the potential of the first signal PO_L at the node N61 is inverted from H level to L level, and the potential of the second signal PO_H at the node N71 remains H level. At this time, the output of the AND gate 81 changes from H level to L level, and the output of the NOR gate 82 remains L level. As a result, the node N81 which is the output of the SR flip-flop circuit 83 remains H level.

Figure 11C:
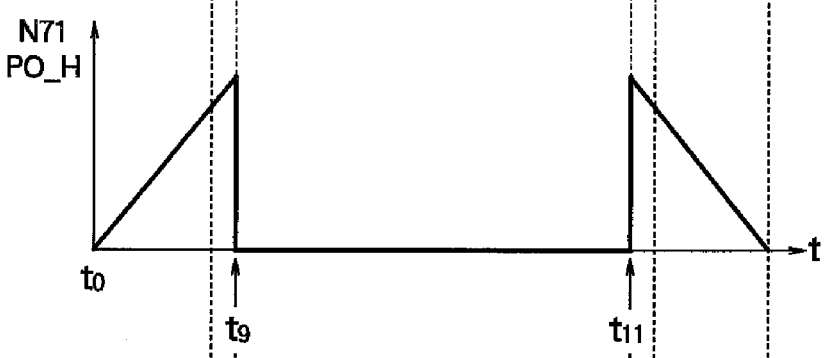
Figure 11D:
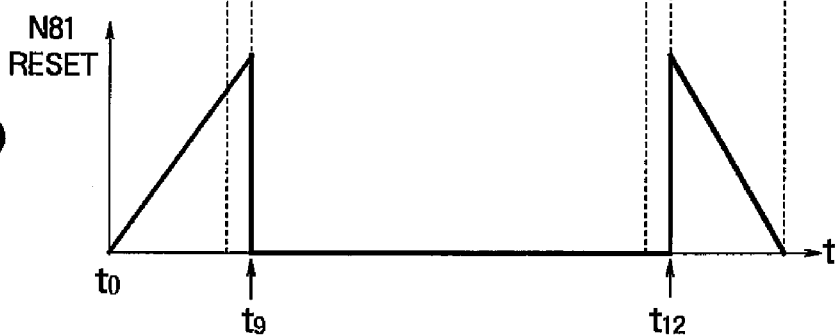
Figure 12E:
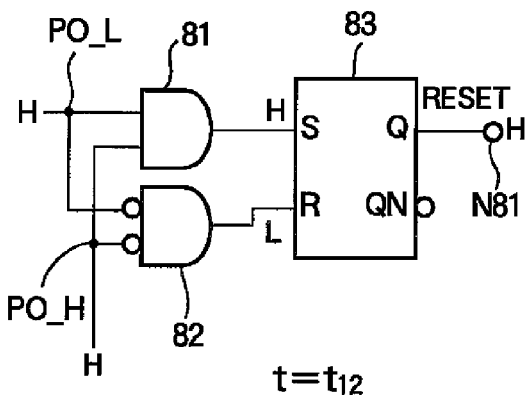
Figure 12C:
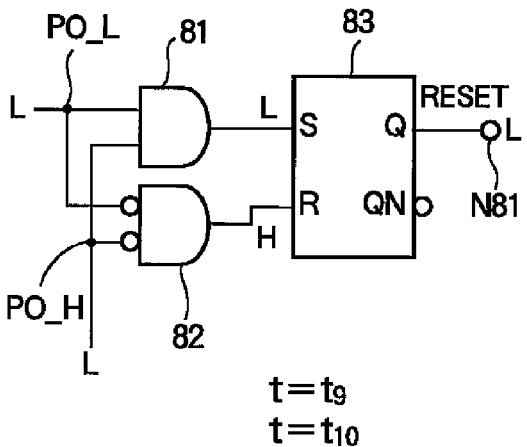

As illustrated in FIG. 11C and FIG. 12C, at a time $t_9$, the potential of the second signal PO_H at the node N71 is inverted from H level to L level. At this time, the output of the AND gate 81 remains L level, the output of the NOR gate 82 changes from L to H level. As a result, the node N81 which is the output of the SR flip-flop circuit 83 changes from H level to L level, and thus the reset signal RESET is generated.

Next, it will be explained how the circuit operates when the power supply potential falls. At a time $t_{10}$, the power supply potential in the power-on reset circuit of FIG. 10 drops, and then the potential VDD of the power supply terminals 64 and 74 drops as illustrated in FIG. 11A. As illustrated in FIGS. 11A to 11D and FIG. 12D, at a time $t_{11}$, the potential of the first signal PO_L at the node N61 is L level, the potential of the second signal PO_H at the node N71 changes from L to H level, the output of the AND gate 81 is L level, and the output of the NOR gate 82 is L level. As a result, the node N81 which is the output of the SR flip-flop circuit 83 remains L level.

As illustrated in FIG. 11C and FIG. 12E, at a time $t_{12}$, the potential of the first signal PO_L at the node N61 is inverted from L to H level. At this time, the output of the AND gate 81 changes from L to H level, and the output of the NOR gate 82 remains L level. As a result, the node N81 which is the output of the SR flip-flop circuit 83 is inverted from L to H level.

As described above, according to the power-on reset circuit of the fourth embodiment, the reset signal can be stably outputted, even if the potential VDD of the power supply terminals 64 and 74 rises slowly or if a momentary power outage occurs after the potential VDD rises. According to the power-on reset circuit of the fourth embodiment, it is unnecessary for a semiconductor integrated circuit to have a resistor of a high resistance value in order to reduce consumption power, unlike the conventional art, thereby a size of the circuit and consumption power can reduced.

In the power-on reset circuit according to the fourth embodiment, when the power supply potential VDD rises, the potential of the node N81 is inverted and the reset signal RESET is generated at timing depending on the second sensor circuit 70 (at the time $t_9$). On the other hand, when the power supply potential VDD falls, the potential of the node N81 is inverted at timing depending on the first sensor circuit 60 (at the time $t_{12}$). Therefore, in the power-on reset circuit according to the fourth embodiment, timing of potential inversion of the reset signal can be independently set for the rising and the falling of the power supply potential.

Those skilled in the art will recognize that further variations are possible within the scope of the invention, which is defined in the appended claims.

What is claimed is:

1. A power-on reset circuit comprising:
   a first-conductive-type MOS transistor having a first source connected to a first power supply, a first drain, and a first gate connected to a second power supply, a potential of the first power supply gradually rising when power is turned on in the power-on reset circuit, the second power supply supplying a fixed electric potential;
   a second-conductive-type MOS transistor having a second source connected to the second power supply, a second drain connected to the first drain, and a second gate, to which a bias potential which depends on a potential of a power supply is applied;
   a bias circuit applying the bias potential depending on the potential of the power supply to the second gate, the bias circuit having a circuit structure to supply a constant current to the second-conductive-type MOS transistor when power is turned on in the power-on reset circuit, the constant current being proportional to a current supplied from the power supply, the constant current being constant in a process that the potential of the first power supply rises gradually so that the bias potential is constant in the process that the potential of the first power supply rises gradually; and
   an output node for outputting a reset signal corresponding to a potential of the first drain, in a process that a voltage between the first power supply and the second power supply increases.

2. The power-on reset circuit according to claim 1, wherein the first-conductive-type MOS transistor is a P-type MOS transistor, and the second-conductive-type MOS transistor is an N-type MOS transistor.

3. The power-on reset circuit according to claim 2, further comprising an inverter having an input terminal connected to the first drain and an output terminal connected to the output node.

4. The power-on reset circuit according to claim 1, wherein the circuit structure of the bias circuit comprises a first current mirror circuit connected to a second current mirror circuit, the bias potential provided from an interconnection node between the first and second current mirror circuits.

5. A power-on reset circuit comprising:
a first-conductive-type MOS transistor having a first source connected to a first power supply, a first drain, and a first gate connected to a second power supply, a potential of the first power supply gradually rising when power is turned on in the power-on reset circuit, the second power supply supplying a fixed electric potential;
a second-conductive-type MOS transistor having a second source connected to the second power supply, a second drain connected to the first drain, and a second gate;
an output node that outputs a reset signal corresponding to a potential of the first drain, during a process that a voltage between the first power supply and the second power supply increases; and
a bias circuit configured to apply a bias potential to the second gate, the bias potential depending on a potential of a power supply,
wherein the bias circuit has a circuit structure to supply a constant current to the second-conductive-type MOS transistor when power is turned on in the power-on reset circuit, the constant current being proportional to a current supplied from the power supply, the constant current being constant in a process that the potential of the first power supply rises gradually so that the bias potential is constant in the process that the potential of the first power supply rises gradually.

6. The power-on reset circuit according to claim 5, wherein the first-conductive-type MOS transistor is a P-type MOS transistor, and the second-conductive-type MOS transistor is an N-type MOS transistor.

7. The power-on reset circuit according to claim 6, further comprising an inverter having an input terminal connected to the first drain and an output terminal connected to the output node.

8. The power-on reset circuit according to claim 5, wherein the circuit structure of the bias circuit comprises a first current mirror circuit connected to a second current mirror circuit, the bias potential provided from an interconnection node between the first and second current mirror circuits.

9. A power-on reset circuit comprising:
a first-conductive-type MOS transistor having a first source connected to a first power supply, a first drain, and a first gate connected to a second power supply, a potential of the first power supply gradually rising when power is turned on in the power-on reset circuit, the second power supply supplying a fixed electric potential;
a second-conductive-type MOS transistor having a second source connected to the second power supply, a second drain connected to the first drain, and a second gate, to which a bias potential which depends on a power supply is applied;
an output node that outputs a reset signal corresponding to a potential of the first drain when a voltage between the first power supply and the second power supply increases;
a bias circuit configured to apply a bias potential to the second gate, the bias potential depending on a potential of a power supply, the bias circuit having a circuit structure to supply a constant current to the second conductive type MOS transistor when power is turned on in the power-on reset circuit, the constant current being proportional to a current supplied from the power supply, the constant current being constant in a process that the potential of the first power supply rises gradually so that the bias potential is constant in the process that the potential of the first power supply rises gradually; and
a non-inverting buffer having an input terminal connected to the first drain and an output terminal connected to the output node.

10. A power-on reset circuit comprising:
a first-conductive-type MOS transistor having a first source connected to a first power supply, a first drain, and a first gate connected to a second power supply, a potential of the first power supply supplying a fixed electric potential, the second power supply gradually rising when power is turned on in the power-on reset circuit;
a second-conductive-type MOS transistor having a second source connected to the second power supply, a second drain connected to the first drain, and a second gate, to which a bias potential which depends on a potential of a power supply is applied;
a bias circuit applying the bias potential depending on the potential of the power supply to the second gate, the bias circuit having a circuit structure to supply a constant current to the second-conductive-type MOS transistor when power is turned on in the power-on reset circuit, the constant current being proportional to a current supplied from the power supply, the constant current being constant in a process that the potential of the second power supply rises gradually so that the bias potential is constant in the process that the potential of the second power supply rises gradually; and
an output node for outputting a reset signal corresponding to a potential of the first drain, in a process that a voltage between the first power supply and the second power supply increases.

11. The power-on reset circuit according to claim 10, wherein the first-conductive-type MOS transistor is an N-type MOS transistor, and the second-conductive-type MOS transistor is a P-type MOS transistor.

12. The power-on reset circuit according to claim 11, further comprising a buffer having an input terminal connected to the first drain and an output terminal connected to the output node.

13. The power-on reset circuit according to claim 10, wherein the circuit structure of the bias circuit comprises a first current mirror circuit connected to a second current mirror circuit, the bias potential provided from an interconnection node between the first and second current mirror circuits.

14. A power-on reset circuit comprising:
a first-conductive-type MOS transistor having a first source connected to a first power supply, a first drain, and a first gate connected to a second power supply, a potential of the first power supply supplying a fixed electric potential, the second power supply gradually rising when power is turned on in the power-on reset circuit;
a second-conductive-type MOS transistor having a second source connected to the second power supply, a second drain connected to the first drain, and a second gate;
an output node that outputs a reset signal corresponding to a potential of the first drain, during a process that a voltage between the first power supply and the second power supply increases; and
a bias circuit configured to apply a bias potential to the second gate, the bias potential depending on a potential of a power supply,
wherein the bias circuit has a circuit structure to supply a constant current to the second-conductive-type MOS transistor when power is turned on in the power-on reset circuit, the constant current being proportional to a current supplied from the power supply, the constant current being constant in a process that the potential of the second power supply rises gradually so that the bias potential is constant in the process that the potential of the second power supply rises gradually.

15. The power-on reset circuit according to claim 14, wherein the circuit structure of the bias circuit comprises a first current mirror circuit connected to a second current mirror circuit, the bias potential provided from an interconnection node between the first and second current mirror circuits.

16. The power-on reset circuit according to claim 14, wherein the first-conductive-type MOS transistor is an N-type MOS transistor, and the second-conductive-type MOS transistor is a P-type MOS transistor.

17. The power-on reset circuit according to claim 16, further comprising a non-inverting buffer having an input terminal connected to the first drain and an output terminal connected to the output node.

* * * * *